US005440943A

United States Patent [19]
Holt et al.

[11] Patent Number: 5,440,943
[45] Date of Patent: Aug. 15, 1995

[54] ELECTRONIC TEST HEAD MANIPULATOR

[75] Inventors: Alyn R. Holt; Robert E. Matthiessen, both of Cherry Hill; Christopher L. West, Tabernacle, all of N.J.

[73] Assignee: inTEST Corporation, Cherry Hill, N.J.

[21] Appl. No.: 122,055

[22] Filed: Sep. 15, 1993

[51] Int. Cl.6 .................... F16H 25/20; B25J 1/12
[52] U.S. Cl. .................... 74/89.15; 248/277; 248/913; 269/71; 324/758; 414/626; 414/744.3; 414/917
[58] Field of Search ............ 74/89.15; 254/122; 269/71; 324/75 B; 414/626, 749, 751, 744.3, 917; 248/277, 913

[56] References Cited

U.S. PATENT DOCUMENTS

| | | | |
|---|---|---|---|
| 1,554,746 | 9/1925 | Meinel | 248/277 |
| 2,697,529 | 12/1954 | Hubbell et al. | 901/23 |
| 2,786,434 | 3/1957 | Klungtvedt | 269/71 X |
| 2,902,349 | 9/1959 | Lerner | 254/122 X |
| 3,262,593 | 7/1966 | Hainer | 414/619 |
| 3,826,383 | 7/1974 | Richter | 214/1 BD |
| 4,025,053 | 5/1977 | Stickle | 254/122 |
| 4,160,207 | 7/1979 | Haines | 324/158 F |
| 4,199,294 | 4/1980 | Streck et al. | 414/739 |
| 4,229,136 | 10/1980 | Panissidi | 414/673 |
| 4,273,506 | 6/1981 | Thomson et al. | 414/735 |
| 4,303,368 | 12/1981 | Dent et al. | 414/590 |
| 4,403,680 | 9/1983 | Hillesheimer | 187/18 |
| 4,589,815 | 5/1986 | Smith | 414/590 |
| 4,705,447 | 11/1987 | Smith | 324/158 F |
| 4,730,975 | 3/1988 | Munakata | 414/744.3 X |
| 4,893,074 | 1/1990 | Holt et al. | 324/158 F |
| 4,896,869 | 1/1990 | Takekoshi | 269/71 X |
| 4,989,823 | 2/1991 | Chapman | 248/913 X |
| 5,030,869 | 7/1991 | Holt et al. | 324/158 F |
| 5,222,854 | 6/1993 | Blatt et al. | 414/749 X |

FOREIGN PATENT DOCUMENTS

| | | |
|---|---|---|
| 0032119 | 7/1981 | European Pat. Off. |
| 0102217 | 3/1984 | European Pat. Off. |
| 0342045 | 11/1989 | European Pat. Off. |
| 0468906 | 1/1992 | European Pat. Off. |
| 0526996 | 2/1993 | European Pat. Off. |

OTHER PUBLICATIONS

European Search Report dated Dec. 15, 1994. EP 94306461.

*Primary Examiner*—Allan D. Herrmann
*Attorney, Agent, or Firm*—Ratner & Prestia

[57] ABSTRACT

A positioner facilitates docking and undocking of an electronic test head with a device handler. The position provides for rotation of the test head about a first axis. The positioner includes a scissor arm structure for moving the test head along a second axis orthogonal to the first axis 18 Claims, 8 Drawing Sheets

ELECTRONIC TEST HEAD MANIPULATOR

FIELD OF THE INVENTION

This invention relates to the field of art of electronic test head positioners.

BACKGROUND OF THE INVENTION

In the automatic testing of integrated circuits (IC) and other electronic devices, special device handlers have been used which brings the device to the proper temperature and places the device to be tested in position. The electronic testing itself is provided by a large and expensive automatic testing system which includes a test head which has been required to connect to and dock with the device handler. In such testing systems, the test head has usually been very heavy—on the order of 40 to 300 kilograms. The reason for this heaviness is that the test head uses precision high frequency control and data signals so that the electronic circuits may be located as close as possible to the device under test. Accordingly, the test head has been densely packaged with electronic circuits in order to achieve the accurate high speed testing of the sophisticated devices.

Test head positioner systems may be used to position the test head with respect to the device handler. When the test head is accurately in position with respect to the device handler, the test head and the device handler are said to be aligned. When the test head and device handler are aligned, the fragile test head and device handler electrical connectors can be brought together (i.e. docked), enabling the transfer of test signals between the test head and the device handler. Prior to docking, the fragile test head and device handler electrical connectors must be precisely aligned to avoid damaging the fragile electrical connectors.

A positioner, able to move along a support structure, carries the test head to the desired location at which the test head is positioned to connect to and dock with the device handler. The test head is attached to the positioners so that the test head can achieve six degrees of freedom (X, Y, Z, $\theta X$, $\theta Y$, $\theta Z$).

Test heads, and their respective positioners, are often used in an ultraclean room environment. However, ultraclean room environments are often extremely expensive to provide. Thus, the use able space within an ultraclean environment is only available at a premium.

A variety of test head manipulators are currently available for use in ultraclean room environments. Although some of these test head manipulators have a variety of desirable features, the amount of space which each of these test head manipulators requires for proper operation may be undesirable.

SUMMARY OF THE INVENTION

A positioner facilitates docking and undocking of an electronic test head with a device handler. The positioner provides for rotation of the test head about a first axis. The positioner includes a linkage arm structure for moving the test head along a second axis orthogonal to the first axis.

DETAILED DESCRIPTION OF THE INVENTION

Figure 1:
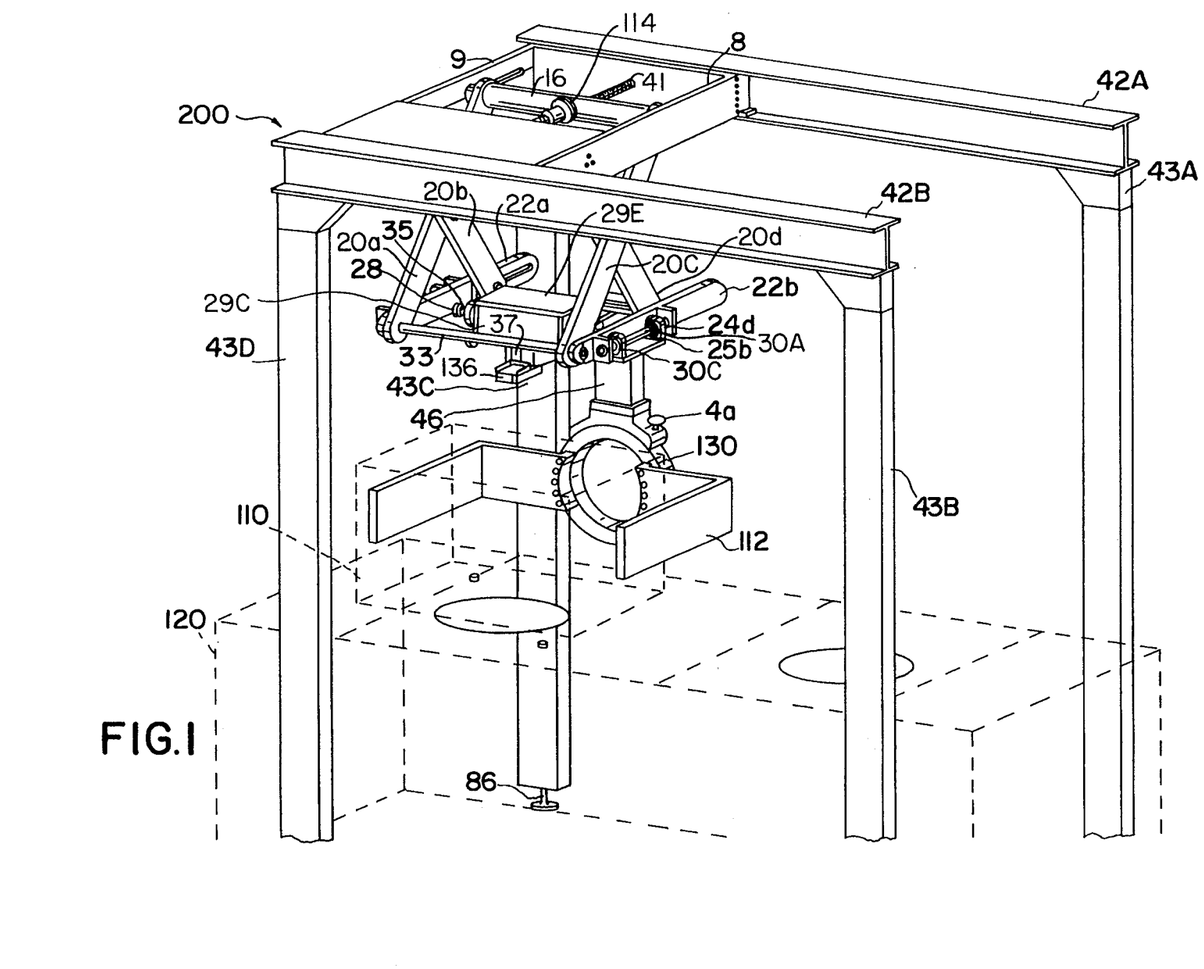
FIG. 1 is a perspective drawing which illustrates an exemplary embodiment of the present invention.
Figure 8:
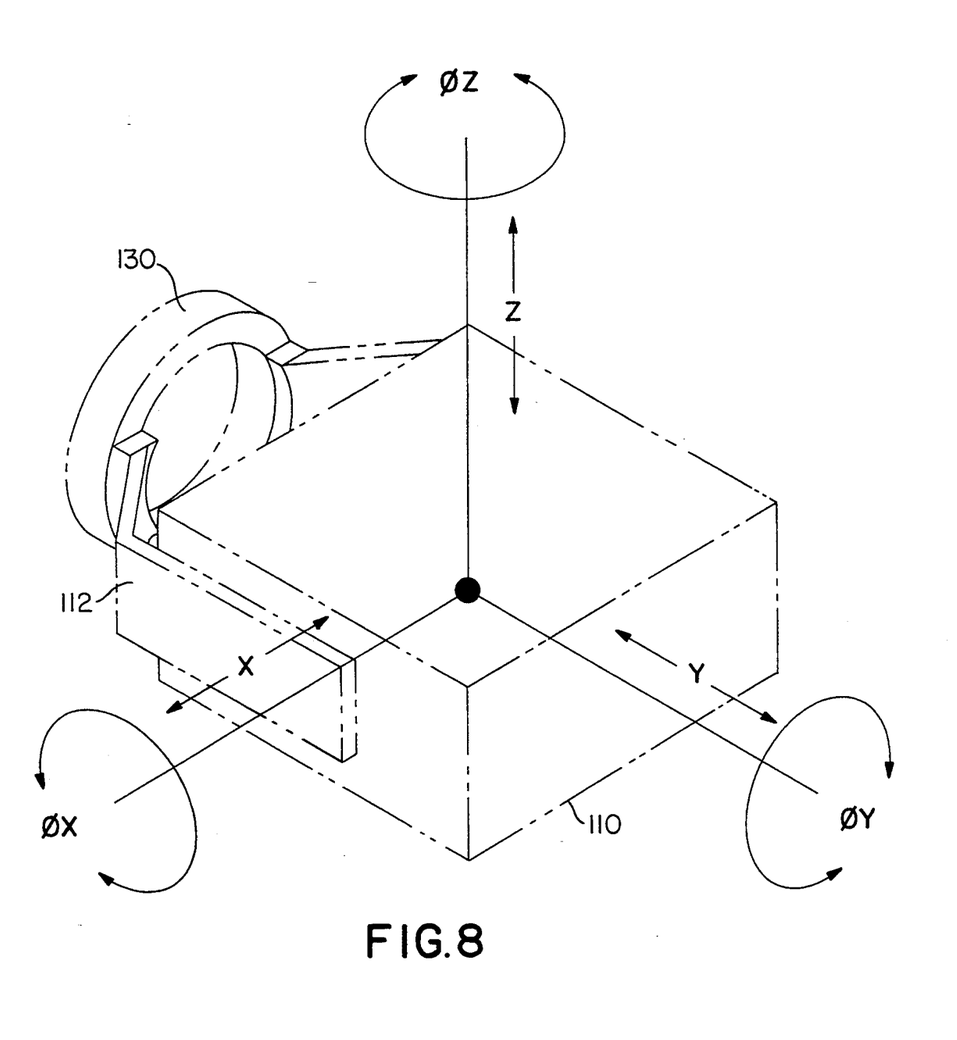
FIG. 8 diagrammatically shows the six degrees of freedom of the system shown in FIGS. 1, 4 and 5.

Referring now to FIG. 1, there is shown a test head positioner system 200 in accordance with an exemplary embodiment of the present invention. As shown, positioner system 200 carries a test head 110 for a test system for docking with an electrical connector (not shown) of an integrated circuit handler 120. It will be understood that other electronic devices may be handled by the device handler, such as transistors, chips or dies, etc. In operation, positioner system 200 moves test head 110 accurately and precisely so that it may be docked to handler 120. Docking may be accomplished, for example, as more fully described in a previous patent by Smith (U.S. Pat. No. 4,705,447), herein incorporated by reference, and in a previous patent by Holt (U.S. Pat. No. 4,893,074), which is herein incorporated by reference. As will be described in detail, the position of test head 110 may be accurately manipulated to another position with six degrees of freedom X, Y, Z, $\theta X$, $\theta Y$, $\theta Z$. As shown in FIG. 8, it is important for the proper installation of test head 110 that it have six degrees of freedom so that it can accurately be positioned with respect to handler 120. Furthermore, the motion of test head 110 can be restricted so that it moves with only two degrees of motion (for example $\theta Y$, Z). In this manner, test head 110 can be readily undocked and redocked with handler 120, so that maintenance of test head 110 can be performed. In addition, the motion of test head 110 can be restricted so that it moves with only one degree of motion (for example Z). In this manner, test head 110 can be readily undocked and redocked with handler 120 when position assembly 200 is being used by an operator.

The details of positioner assembly 200 are shown in FIG. 1 in which there are provided two I-shaped beams 42a, 42b and two rails 8, 9 forming the top of the carriage support structure assembly. Two legs 43b, 43d (partially shown) are attached to I-shaped beam 42b at opposite ends so as to support beam 42b a predetermined distance from the floor. In addition, two legs 43a (partially shown), 43c are disposed at opposite ends of I-shaped beam 42a to support beam 42a at a predetermined distance from the floor. At the bottom of each leg 43a, 43b, 43c, 43d, a leveling pad 86 may be installed to facilitate leveling of the gantry. Alternatively, the test head positioner system (without, for example, legs) could be suspended from the ceiling over the integrated circuit handler 120.

In an exemplary embodiment of the present invention, test head 110 may be mounted either directly or via a yoke 112 to test head adapter ring 130. The use of test head adapter ring 130 is more fully described in U.S. Pat. No. 5,030,869 which is incorporated herein by reference. By use of test head adapter ring 130, test head 110 is able to rotate at least 180° about an axis which shall be defined as a Y axis. The ability of test head 110 to rotate about the Y axis facilitates maintenance of test head 110 as will be more fully described below.

Figure 2:
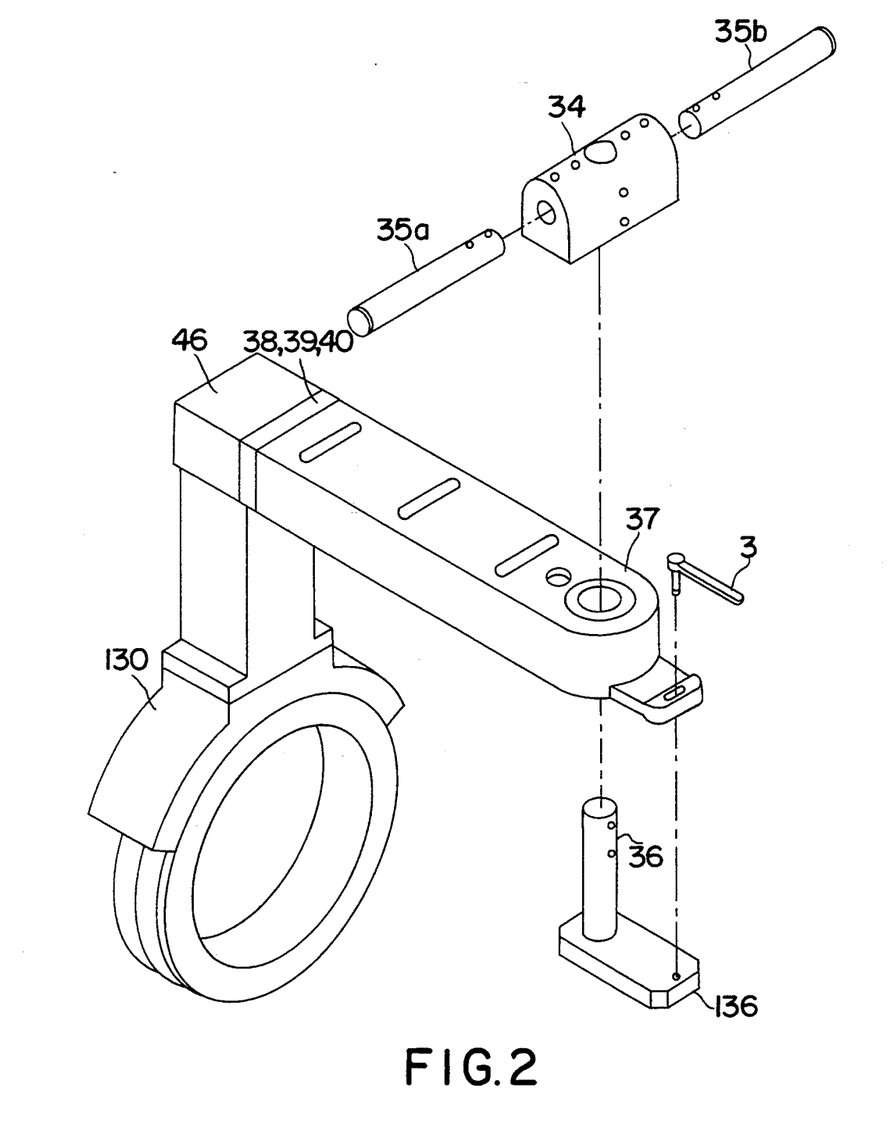
FIG. 2 is a partially exploded perspective drawing which illustrates coupling between a test head adapter ring and a carriage base.

As shown in FIG. 2, test head adapter ring 130 is coupled to cradle side 46. Cradle side 46 may be, for example, a rectangular beam. Cradle side 46 may be coupled, in turn, to cradle back 37. Cradle back 37 is coupled to cradle side 46 at substantially right angles. Spacers 38, 39 and 40 may be interposed between cradle back 37 and cradle side 46 in order to assure that the combined center of gravity of the test head 110, test head adapter ring 130, cradle side 46 and cradle back 37 desirably coincides with the axis of side-to-side shafts 35a and b.

Side-to-side shafts 35a, b are each coupled to wrist block 34 at respective openings. Thus, wrist block 34 is stationary relative to side-to-side shafts 35a, b. An additional opening is situated in the bottom of the wrist block 34. Wrist shaft 36 extends from the opening in the bottom of wrist block 34 through a further opening in cradle back 37. Wrist shaft 36 is coupled to wrist block 34. A flange 136 may be situated at the opposite end of wrist shaft 36 supporting cradle back 37. Wrist shaft 36 defines a Z axis. Cradle back 37 rotates about the Z axis by rotating relative to wrist shaft 36. Thrust bearing 80 (not shown), situated between the flange of wrist shaft 36 and cradle back 37 facilitates rotation of cradle back 37. Movement of cradle back 37 about the Z axis may be prevented by actuating lock wrench 3.

Wrist shaft 36 is coupled to carriage base 26. Coupling between wrist shaft 36 and carriage base 26 is illustrated by FIG. 3.

Figure 3:
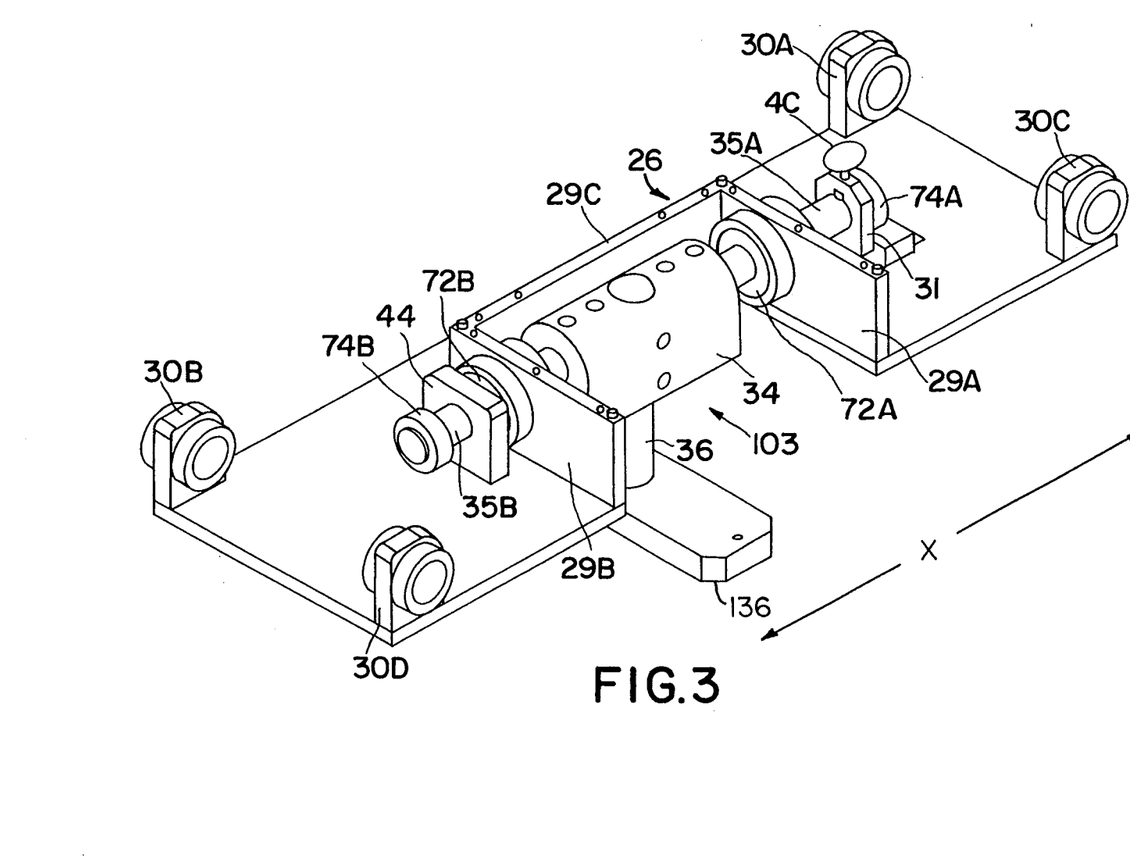
FIG. 3 is a perspective drawing which illustrates coupling between a test head adapter ring and a carriage base.

As shown in FIG. 3, carriage base 26 includes rectangular opening 103. Wrist shaft 36 extends between wrist block 34 and cradle back 37 by going through rectangular opening 103. Stop block 44 and lock collar 31 are respectively situated on opposite sides of the rectangular opening 103. Carriage walls 29a, 29b, 29c, 29d (not shown), are situated about rectangular opening 103. Carriage ceiling 29e (not shown) may be situated on top of carriage walls 29a–d to form a partially enclosed space. Side-to-side shaft 35a extends through carriage wall 29a and lock collar 31 and is terminated with shaft collar 74a. Similarly, side-to-side shaft 35b extends through carriage wall 29b and stop block 44 and is terminated with shaft collar 74b.

Side-to-side shafts 35a, 35b, define an X axis. Thus, wrist block 34 is able to move along the X axis by the sliding motion of side-to-side shafts 35a, 35b relative to lock collar 31 and stop block 44 respectively. Movement along the X axis is limited by shaft collars 74a, b. Wrist block 34 is also able to move about the X-axis defined by side-to-side shafts 35a, b. Movement of wrist block 34 both along and about the X-axis is facilitated by bearings 72a, 72b which may be situated, for example, adjacent to carriage walls 29a, 29b respectively. Wrist block 34 may be prevented from moving both along and about the X axis by actuating clamping knob 4c, shown coupled to lock collar 31.

Figure 4:
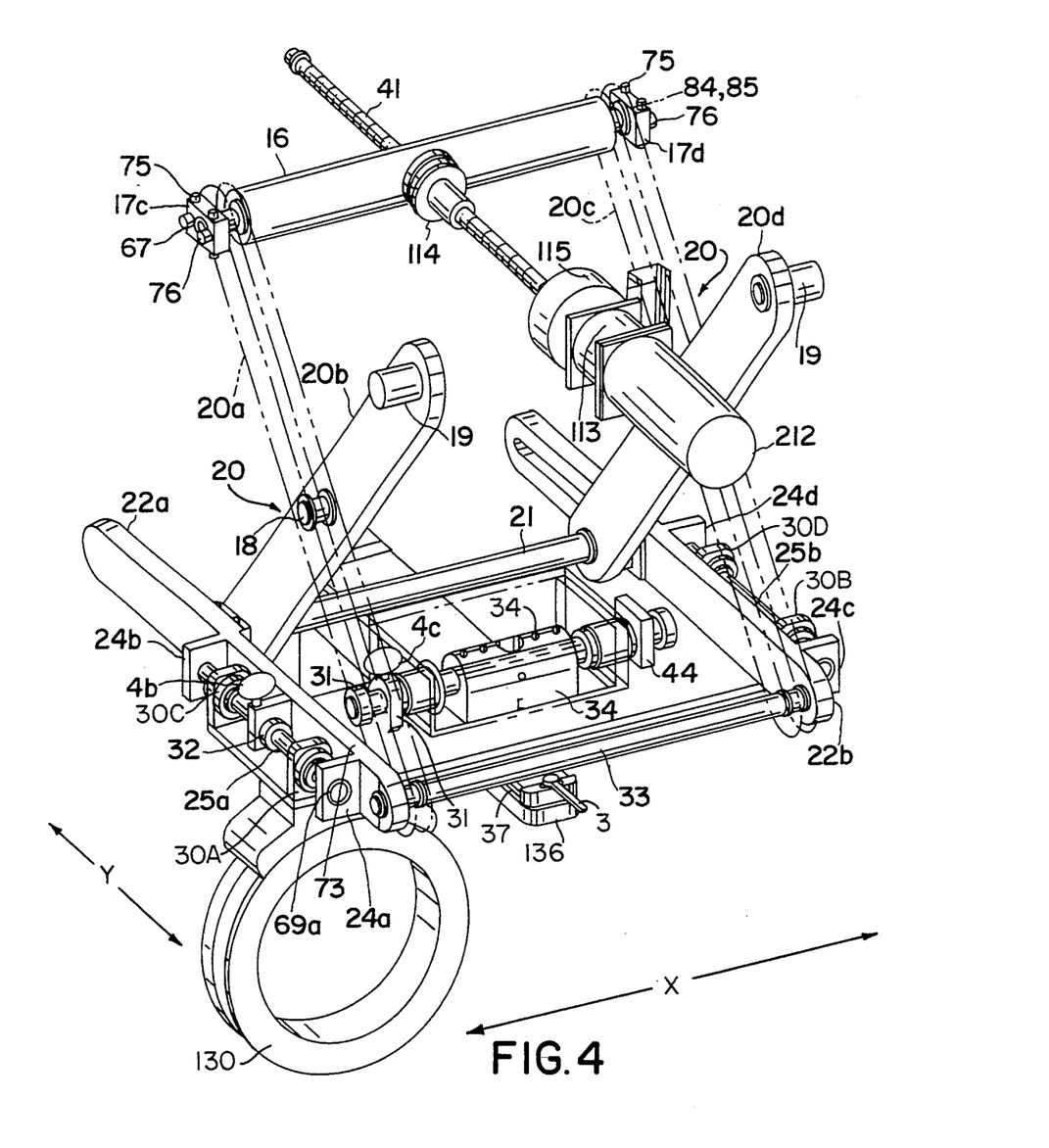
FIG. 4 and 5 are further perspective drawings which illustrate an exemplary embodiment of the present invention.

As shown in FIG. 3, carriage base 26 includes bearing blocks 30a, 30b, 30c, 30d. Bearing blocks 30a, b, c, d enable carriage base 26 to be coupled to carriage rails 22a, b as shown in FIG. 4. Specifically, pillow blocks 24a, bare coupled to carriage rail 22a by each extending from the surface of carriage rail 22a. Similarly, pillow blocks 24c, d, are coupled to carriage rail 22b by each extending from the surface of carriage rail 22b. In-out shaft 25a extends from pillow block 24a to pillow block 24b and is held in position by retaining rings 69a, 69b (not shown). In-out shaft 25b extends from pillow block 24c to pillow block 24d and is held in position by retaining rings 69c, 69d (not shown). In-out shaft 25a extends through lock collar 32 which is also coupled to carriage rail 22a.

In-out shafts 25a, b each define a Y axis. Thus, carriage base 26 is capable of moving along the Y axis as a result of bearing blocks 30a, b, c, d sliding along in-out shafts 25a, b. The Y axis movement is facilitated by bearings 79 mounted in bearing blocks 30a, b, c, d. Movement of carriage base 26 along the Y axis may be prevented by actuating clamping knob 4b, shown coupled to lock collar 32.

Figure 5:
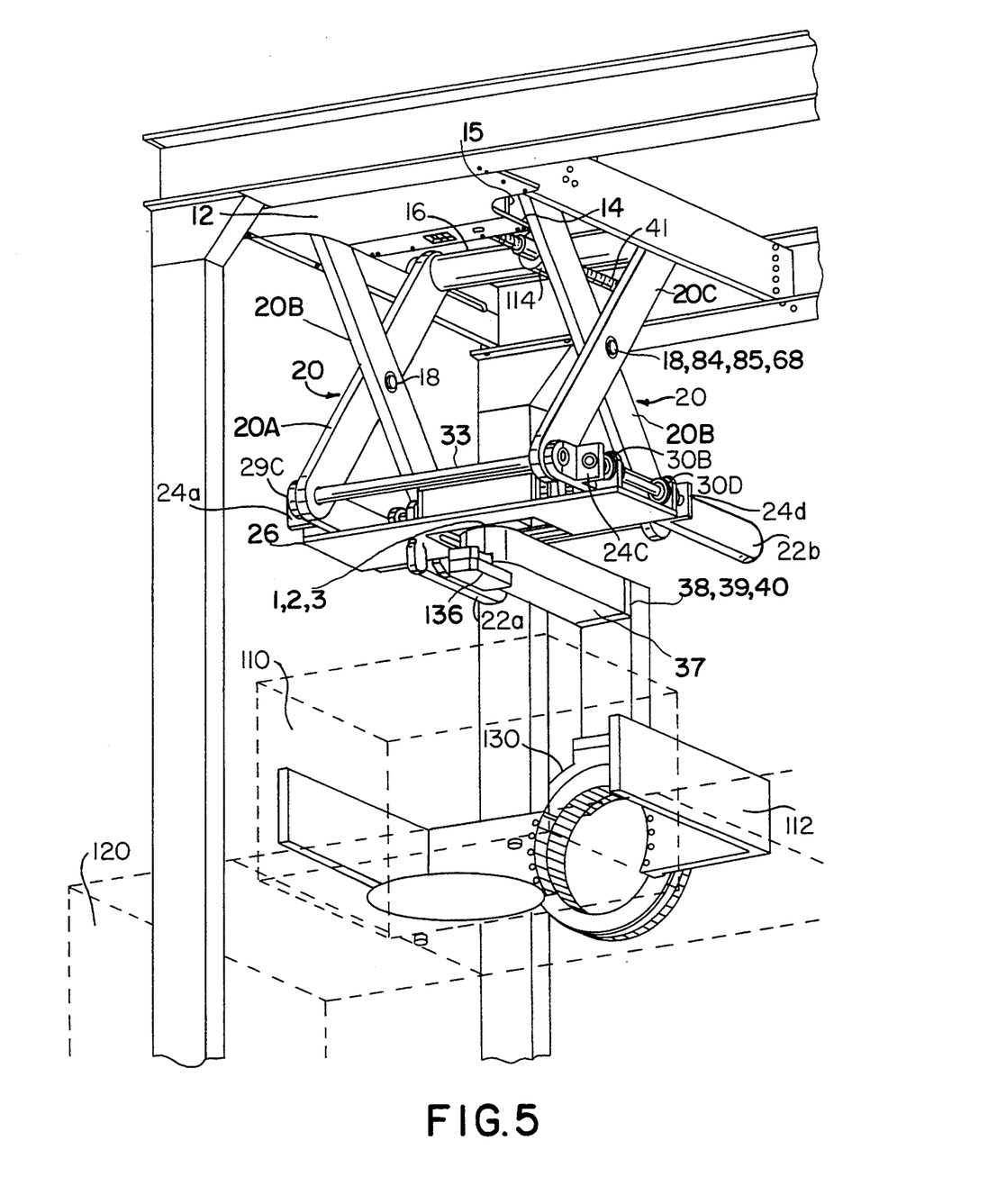

As shown in FIG. 5, linkage arm 20 (shown to the left in the figures) includes linkage arm structure 20a and linkage arm structure 20b. Linkage arm 20 (shown to the right in the figures) includes linkage arm structure 20c and linkage arm structure 20d. Linkage axle 33 includes ends of diminished diameter which extend through openings in linkage arm structures 20a, 20c and is coupled to carriage rails 22a, 22b. In this way, linkage arm structures 20a, 20c are coupled to carriage rails 22a, 22b.

Linkage axle 21 also includes ends of diminished diameter. This is more clearly shown in FIG. 6. One end of linkage axle 21 extends through an opening near the bottom of arm component 20b, and through a further opening in trolley 17a. A similar configuration may be found on the opposite end of linkage axle 21 which extends through an opening in linkage arm structure 20d, and through an opening in a further trolley 17b (not shown). Each trolley 17a, b includes cam followers 76 which engage the slots in carriage rails 22a, b, and thrust bearings 75 which make contact with carriage rails 22a, b. Cam followers 75, 76 facilitate movement of trolleys 17a, 17b relative to carriage rails 22a, b. As the left-most and right-most linkage arms function and are coupled to the remaining apparatus similarly, the operation of linkage arm structures 20a, 20b only will be described.

Figure 6:
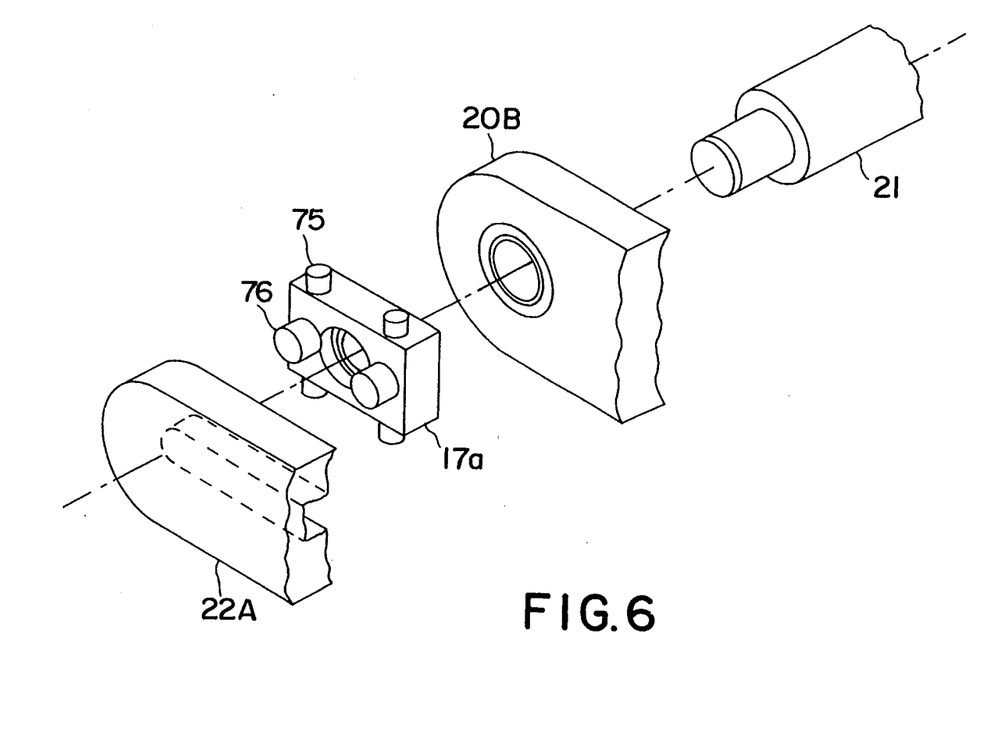
FIG. 6 is an exploded perspective drawing which illustrates coupling between a linkage arm structure and a carriage rail.

Linkage arm structure 20a and linkage arm structure 20b are coupled together by pivot pin 18. Movement of linkage arm structure 20a relative to linkage arm structure 20b is facilitated by needle bearing 84 (not shown).

Linkage arm structure 20a is capable of a limited amount of rotation about linkage axle 33. Furthermore, linkage arm structure 20b is capable of a limited amount of rotation about linkage axle 21. This rotation is useful for vertical motion of test head 110 along the z axis as will be described later.

As shown in FIG. 4, linkage arm structure 20b rotates about pivot pin 19. This pivot pin 19 is fixed to carriage rail 9. As will be described below, this rotation also facilitates vertical movement of test head 110 along the z axis.

As shown in FIG. 4, motor 212 is included. Motor 212 rotates gear box 113. Rotation of gear box 113 may be selectively prevented by the actuation of brake 115. Gear box 113 rotates ball screw 41. As ball screw 41 rotates, ball nut 114 moves along the axis defined by ball screw 41. Ball nut 114 is coupled to ball screw axle 16. Ball screw axle 16 includes a shoulder at each end which projects through respective holes in linkage arm structures 20a, 20d and trolleys 17c, d. Trolleys 17c, d each include cam followers 76 which engage and move along respective tracks which are formed in carriage rails 8, 9. Trolleys 17c, d each also include cam followers 75 which contact and facilitate movement relative to carriage rails 8, 9.

Figure 7:
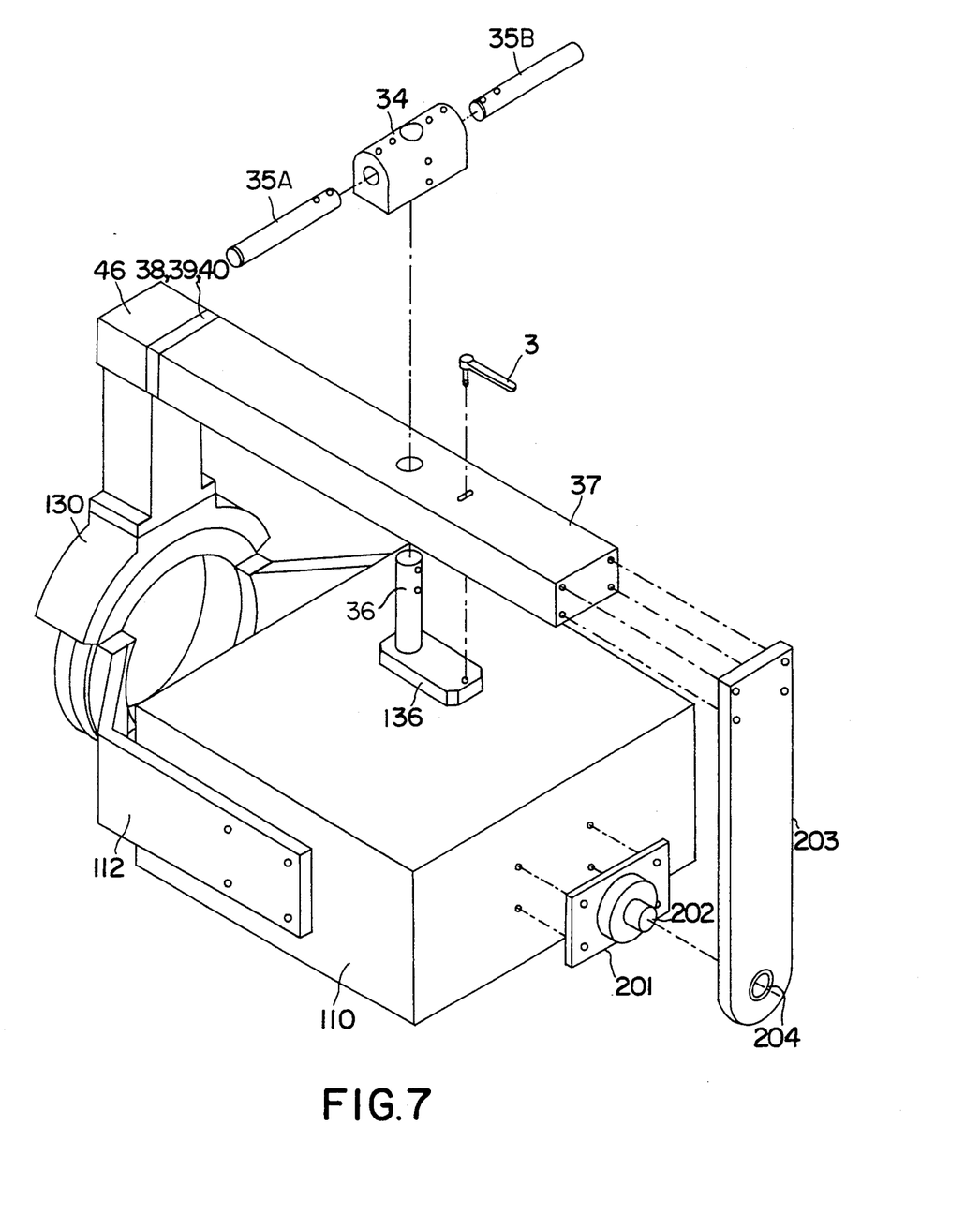
FIG. 7 is a perspective drawing which illustrates a further exemplary embodiment of the present invention.

A further exemplary embodiment of the present invention is illustrated by FIG. 7. The exemplary embodiment of the present invention which is illustrated by FIG. 7 has similarities with the exemplary embodiment of the present invention which is illustrated by FIGS. 1, 4, 5. However, in FIG. 7, fixture 201 is attached to test head 110. Fixture 201 includes a projection 202 which engages an opening 204 in extension bar 203. A bearing (not shown) may be coupled to projection 202 to facilitate rotation of test head 110 about the Y axis as previously discussed. In this further exemplary embodiment, cradle back 37 has sufficient length so that it may be coupled to extension bar 203. In this manner, test head 110 may be supported by yoke 112 and extension bar 203. Furthermore, the placement of projection 202 within opening 204 maintains the ability of test head 110 to rotate about the Y axis. This total configuration enables test heads having weights on the order of 500 pounds to be supported and manipulated.

Vertical motion of test head 110 (i.e. Z axis motion) is accomplished as follows. As motor 212 turns, ball screw 41 also turns. This results in motion of ball nut 114 along the axis defined by ball screw 41. As ball nut 114 moves along the axis defined by ball screw 41, ball screw axle 16 (through trolleys 17c, 17d with cam followers 76) moves along horizontal rails 8, 9. This, in turn, results in the movement of the top portion of linkage arm structures 20a, 20c along horizontal rails 8, 9. As the upper portions of linkage arm structures 20a, 20c move along horizontal rails 8, 9, the bottom portion of linkage arm structures 20a, 20c also moves. This motion of the bottom portion of linkage arm structures 20a, 20c is vertical. The vertical motion of linkage arm structures 20a, 20c results in the vertical movement of carriage rails 22a, 22b. As the front portion of carriage rails 22a, 22b moves vertically, the rear portion of carriage rails 22a, 22b also moves vertically. Thus, as carriage rails 22a, 22b move vertically, test head 110 moves vertically as well. Thus, the linkage arm structures 20a, b, c, d provide a lifting mechanism while at the same time determining the path of motion of test head 110.

During the course of installation, the test head 110 will be moved with six degrees of motion (X, Y, Z, $\theta$X, $\theta$Y, $\theta$Z) so that it may be aligned and placed in contact with device handler 120. Thus, after installation has been completed, movement of the test head 110 in all six degrees of motion will be temporarily restricted until maintenance or operation is required. When an operator wishes to undock the test head 110 from the device handler 120 (e.g. during operation), an operator can undock the test head by moving the test head up and away from the device handler. To accomplish this motion, freedom of motion limited only to the Z direction is adequate. After the test head has been moved upwards in the Z direction, the test head can be moved downwards in the Z direction. In this way, the test head 110 can be redocked with the device handler 120 without losing alignment. Furthermore, should maintenance be required, the test head 110 can be moved upwards in the Z direction and then rotated in the $\theta$Y direction so that the test head contact face upwards (as opposed to downwards, facing the device handler 120 when the test head is in use). Thus, for maintenance purposes, only two degrees of freedom of motion is adequate.

After maintenance has been completed, the test head can be rotated in the $\theta$Y direction and moved downwards in the Z direction. In this way, alignment between the test head 110 and the device handler 120 is again maintained.

The invention has been described with regard to a motor for accomplishing vertical motion. In an exemplary embodiment of the present invention, an electrical stepper motor may be used. In alternate exemplary embodiments of the present invention, a pneumatic motor or a hydraulic motor may be used. However, one skilled in the art would readily recognize that the motor can be replaced with a counter balance system bearing the load of the carriage base 26 with the test head 110 attached. In this manner, operator and equipment safety may be enhanced.

When a motor is used, operator and equipment safety may be enhanced by proximity sensors (not shown) and/or limit switches (not shown). Exemplary proximity sensors (e.g. light or sound activated) may be located, for example, adjacent to the test head 110 in order to determine the position of test head 110 relative to device handler 120. Furthermore, such sensors could also readily determine obstructions between test head 110 and device handler 120. Such sensors could be coupled to the motor in order to disengage the motor if an irregular condition is sensed. Limit switches can be placed at numerous locations (for example, adjacent to the slots located in carriage rails 22a, b) in order to disengage the motor if trolleys 17 reach predetermined positions. One skilled in the art will readily recognize that proximity sensors and/or limit switches may be placed at numerous other locations to ensure proper motion of test head 110.

The invention has been described with regard to a single positioner system. However, additional positioner systems, incorporating for example gantry beams 42a, 42b, may be used adjacent to the positioner system presently illustrated in the figures.

While the invention has been described in terms of an exemplary embodiment, it is contemplated that it may be practiced as outlined above with modifications within the spirit and scope of the appended claims.

What is claimed:

1. A positioner for docking and undocking an electronic test head with a device handler comprising;
   head rotation means for rotating said electronic test head about a first axis;
   vertical motion means, including a plurality of linkage arms coupled to said head rotation means;
   a first of said plurality of linkage arms coupled to a second of said plurality of linkage arms to define a scissor shape of increasable and decreasable length in a vertical direction for moving said electronic test head vertically along a second axis orthogonal to said first axis as an upper end of said first of said plurality of linkage arms moves towards and away from an upper end of said second of said plurality of linkage arms.

2. A positioner according to claim 1, further comprising first horizontal motion means, coupled to the head rotation means, for moving said electronic test head along said first axis.

3. A positioner according to claim 1, further including horizontal motion means for moving said electronic test head along a third axis orthogonal to both said first axis and said second axis, said horizontal motion means comprising:

a wrist block coupled to said head rotation means;

a carriage base coupled to said vertical motion means, said carriage base including a first carriage wall having a third opening and a second carriage wall having a fourth opening;

shaft means including at least one shaft extending from said wrist block at opposite ends thereof, said shaft means extending through said third opening of said first carriage wall and through said fourth opening of said second carriage wall;

locking means, coupled to said carriage base, for selectively preventing movement of said electronic test head along said third axis.

4. A positioner according to claim 1, wherein said electronic test head is vertically disposed relative to said vertical motion means.

5. A positioner according to claim 1, further comprising motor means coupled to the upper ends of said first and second of said plurality of linkage arms, for moving the upper ends of said first and second of said plurality of linkage arms towards and away from each other without causing vertical movement of the upper ends of said first and second of said plurality of linkage arms.

6. A positioner according to claim 5, wherein said vertical motion means further comprises means for rotatably supporting said second linkage arm and for permitting horizontal sliding of said upper end of said first linkage arm with respect to the vertical motion means.

7. A positioner according to claim 5, wherein said vertical motion means further comprises means for rotatably supporting a lower end of said first linkage arm and for permitting horizontal sliding of said lower end of said second linkage arm.

8. A positioner according to claim 7, wherein said vertical motion means further comprises a third linkage arm coupled to a fourth linkage arm to define a further scissor shape and means for rotatably supporting said fourth linkage arm and for permitting horizontal sliding of said upper end of said third linkage arm with respect to the vertical motion means.

9. A positioner according to claim 7, wherein said vertical motion means further comprises a third linkage arm coupled to a fourth linkage arm to define a further scissor shape and means for rotatably supporting a lower end of said third linkage arm and for permitting horizontal sliding of said lower end of said fourth linkage arm.

10. A positioner for docking and undocking an electronic test head with a device handler comprising:

head rotation means for rotating said electronic test head about a first axis;

cradle back means, coupled to said head rotation means, for rotating said electronic test head about a second axis orthogonal to said first axis; and vertical motion means, including a plurality of linkage arms coupled to and situated above said cradle back means;

a first of said plurality of linkage arms coupled to a second of said plurality of linkage arms to define a scissor shape of increasable and decreasable length in a vertical direction for moving said electronic test head up and down vertically along said second axis orthogonal to said first axis as an upper end of said first of said plurality of linkage arms moves towards and away from an upper end of said second of said plurality of linkage arms.

11. A positioner according to claim 10, wherein said vertical motion means includes a linkage arm structure.

12. A positioner according to claim 10, further comprising first horizontal motion means, coupled to the head rotation means, for moving said electronic test head along said first axis.

13. A positioner according to claim 10, further including horizontal motion means for moving said electronic test head about a third axis orthogonal to both said first axis and said second axis, said horizontal motion means comprising:

a wrist block coupled to said head rotation means;

a carriage base coupled to said vertical motion means, said carriage base including a first carriage wall having a third opening and a second carriage wall having a fourth opening;

shaft means including at least one shaft extending from said wrist block at opposite ends thereof, said shaft means extending through said third opening of said first carriage wall and through said fourth opening of said second carriage wall;

locking means, coupled to said carriage base, for selectively preventing movement of said electronic test head about said third axis.

14. A positioner according to claim 10, further comprising motor means coupled to the upper ends of said first and second of said plurality of linkage arms, for moving the upper ends of said first and second of said plurality of linkage arms towards and away from each other without causing vertical movement of the upper ends of said first and second of said plurality of linkage arms.

15. A positioner for docking and undocking a electronic test head with a device handler comprising:

head rotation means for rotating said electronic test head about a first axis;

vertical motion means, including a linkage arm structure coupled to said head rotation means for moving said electronic test head along a second axis orthogonal to said first axis; and first horizontal motion means, coupled to the head rotation means, for moving said electronic test head along said first axis, said first horizontal motion means including:

a carriage base coupled to said head rotation means, said carriage base including a first bearing block having a first opening and a second bearing block having a second opening;

a first shaft and a second shaft, said first shaft and said second shaft each coupled to said vertical motion means;

said first shaft extending through said first opening of said first bearing block and said second shaft extending through said second opening of said second bearing block so that said electronic test head moves along said first axis by said carriage base sliding along said first shaft and said second shaft.

16. A positioner for docking and undocking a electronic test head with a device handler comprising:

head rotation means for rotating said electronic test head about a first axis;

vertical motion means, including a linkage arm structure coupled to said head rotation means for moving said electronic test head along a second axis orthogonal to said first axis; and horizontal motion means for moving said electronic test head along a third axis orthogonal to both said first axis and said second axis, said horizontal motion means comprising:

a) a wrist block coupled to said head rotation means;
b) a carriage base coupled to said vertical motion means, said carriage base including a first carriage wall having a third opening and a second carriage wall having a fourth opening;
c) shaft means including at least one shaft extending from said wrist block at opposite ends thereof, said shaft means extending through said third opening of said first carriage wall and through said fourth opening of said second carriage wall;
d) locking means, coupled to said carriage base, for selectively preventing movement of said electronic test head along said third axis.

17. A positioner for docking and undocking an electronic test head with a device handler comprising:
head rotation means for rotating said electronic test head about a first axis;
cradle back means, coupled to said head rotation means, for rotating said electronic test head about a second axis orthogonal to said first axis; and
vertical motion means, coupled to and situated above said cradle back means for moving said electronic test head up and down along said second axis and first horizontal motion means, coupled to the head rotation means, for moving said electronic test head along said first axis, said vertical motion means including:
a) a carriage base coupled to said head rotation means, said carriage base including first bearing block having a first opening and a second bearing block having a second opening;
b) a first shaft and a second shaft, said first shaft and said second shaft each coupled to said vertical motion means;
c) said first shaft extending through said first opening of said first bearing block and said second shaft extending through said second opening of said second bearing block so that said electronic test head moves along said first axis by said carriage base sliding along said first shaft and said second shaft.

18. A positioner for docking and undocking an electronic test head with a device handler comprising:
head rotation means for rotating said electronic test head about a first axis;
cradle back means, coupled to said head rotation means, for rotating said electronic test head about a second axis orthogonal to said first axis; and
vertical motion means, coupled to and situated above said cradle back means for moving said electronic test head up and down along said second axis and
horizontal motion means for moving said electronic test head along a third axis orthogonal to both said first axis and said second axis, said horizontal motion means comprising:
a) a wrist block coupled to said head rotation means;
b) a carriage base coupled to said vertical motion means, said carriage base including a first carriage wall having a third opening and a second carriage wall having a fourth opening;
c) shaft means including at least one shaft extending from said wrist block at opposite ends thereof, said shaft means extending through said third opening of said first carriage wall and through said fourth opening of said second carriage wall;
d) locking means, coupled to said carriage base, for selectively preventing movement of said electronic test head along said third axis.

* * * * *